United States Patent
Song et al.

(10) Patent No.: US 8,463,582 B2
(45) Date of Patent: Jun. 11, 2013

(54) MODELING NONLINEAR SYSTEMS

(75) Inventors: Dong Song, Irvine, CA (US); Vasilis Z. Marmarelis, Rancho Palos Verdes, CA (US); Theodore W. Berger, Rancho Palos Verdes, CA (US)

(73) Assignee: University of Southern California, Los Angeles, CA (US)

( * ) Notice: Subject to any disclaimer, the term of this patent is extended or adjusted under 35 U.S.C. 154(b) by 1065 days.

(21) Appl. No.: 12/135,904

(22) Filed: Jun. 9, 2008

(65) Prior Publication Data

US 2009/0089022 A1   Apr. 2, 2009

Related U.S. Application Data

(60) Provisional application No. 60/942,520, filed on Jun. 7, 2007.

(51) Int. Cl.
*G06F 17/10* (2006.01)

(52) U.S. Cl.
USPC ............................................................. 703/2

(58) Field of Classification Search
CPC ................................................... G06F 17/5018
USPC ........... 703/2; 706/15; 623/11.11; 708/401; 607/45
See application file for complete search history.

(56) References Cited

U.S. PATENT DOCUMENTS

| | | | |
|---|---|---|---|
| 6,363,369 B1 * | 3/2002 | Liaw et al. | 706/15 |
| 2005/0021104 A1 * | 1/2005 | DiLorenzo | 607/45 |
| 2006/0265022 A1 * | 11/2006 | John et al. | 607/45 |

FOREIGN PATENT DOCUMENTS

WO   WO 2008/151327   12/2008

OTHER PUBLICATIONS

Marmarelis, Vasilis, Identification of nonlinear biological systems using laguerre expansions of kernels, Nov. 11, 1993, Springer Netherlands, vol. 21, issue 6, pp. 573-589.*
Volterra series, Wikipedia, http://en.wikipedia.org/wiki/Volterra_kernel, retreived, Sep. 7, 2011, 4 pages.*
Berger, T.W. et al., "Restoring lost cognitive function," IEEE Engineering in Medicine and Biology Magazine, vol. 24, pp. 30-44, 2005.
Berger, T.W. et al., "A biological based model of functional properties of the hippocampus," Neural Networks, vol. 7, No. 6/7, pp. 1031-1064, 1994.
Berger, T.W. et al., "Brain-implantable biomimetic electronics as the next era in neural prosthetics," Proceedings of the IEEE, vol. 89, No. 7, pp. 993-1012, 2001.
Berger, T.W., "Advanced Methods of Neurophysiological Signal Analysis & System Modeling," 2006 Biomedical Simulation Resource Workshopn, 19 slides [relevant slides only].
Brown, E.N. et al., "The time-rescaling theorem and its application to neural spike train data analysis," Neural Computation, vol. 14, pp. 325-346, 2001.

(Continued)

*Primary Examiner* — Kamini S Shah
*Assistant Examiner* — Luke Osborne
(74) *Attorney, Agent, or Firm* — Fish & Richardson P.C.

(57) ABSTRACT

Systems and techniques, including machine-readable instructions, for modeling of nonlinear systems. In one aspect, an apparatus includes a collection of two or more inputs configured and arranged to receive input signals, a collection of two or more outputs configured and arranged to output output signals, a processing unit configured to transform the input signals into the output signals, wherein the transformation is non-linear and treats the non-linear system as a collection of multiple input, single output non-linear systems, and a data storage that stores characteristics of the transformation.

11 Claims, 12 Drawing Sheets

OTHER PUBLICATIONS

Georgopoulos, A.P. et al., "Neuronal population coding of movement direction," Science, vol. 233, No. 4771, pp. 1416-1419, 1986.

Hines, M.L. and N.T. Carnevale, "The NEURON simulation environment," Neural Computation vol. 9, pp. 1179-1209 (1997).

Keat, J. et al., "Predicting every spike: a model for the responses of visual neurons," Neuron, vol. 30, pp. 803-817, 2001.

Marmarelis, V.Z. "Modeling of Neural Systems by Use of Neuronal Modes," IEEE Transactions on Biomedical Engineering, vol. 40, No. 11, pp. 1149-1158, 1993.

Marmarelis, V.Z. and P. Z. Marmarelis, "Linear and Nonlinear Systems—The Volterra Series," Section 4.1 of Chapter 4 in *Analysis of Physiological Systems: the White-Noise Approach*. New York: Plenum, 1978,. pp. 134-142.

Marmarelis, V.Z., "The Laguerre Expansion Technique," Section 2.3.2 of Chapter 2 in *Nonlinear Dynamic Modeling of Physiological Systems*. Hoboken: Wiley-IEEE Press, 2004., pp. 107-121.

Paninski, L. et al., "Maximum likelihood estimation of a stochastic integrate-and-fire neural encoding model," Neural Computation, vol. 16, pp. 2533-2561, 2004.

Schwartz, A.B. "Primate motor cortex and free arm movements to visual targets in 3-dimensional space .1. Relations between single cell discharge and direction of movement," Journal of Neuroscience, vol. 8, pp. 2913-2927, 1988.

Schwartz, A.B., "Cortical neural prosthetics," Ann Rev Neurosci, vol. 27, pp. 487-507 (2004).

Song, D. et al., Multiple-Input Multiple-Output Models of Spike Train Transformation in Hippocampus, Biomedical Engineering Society Annual Conference, Abstract No. 185, (2006).

Song, D. et al., "Nonlinear Dynamic Modeling of Spike Train Transformations for Hippocampal-Cortical Prostheses," IEEE Transactions on Biomedical Engineering, vol. 54, Iss. 6, pp. 1053-1066 (Jun. 2007).

Song, D. et al., "Parametric and non-parametric models of short-term plasticity," Proceedings of the Second Joint EMBS/BMES Conference, Houston, TX, vol. 3, pp. 1964-1965, Oct. 23-26, 2002.

Truccolo, W. et al., "A point process framework for relating neural spiking activity to spiking history, neural ensemble, and extrinsic covariate effects," J Neurophysiol, vol. 93, pp. 1074-1089, 2005.

Song, Dong et al., "Physiologically Plausible Stochastic Nonlinear Kernel Models of Spike Train to Spike Train Transformation," *Proceedings of the 28th IEEE, EMBS Annual International Conference*, New York City, USA, Aug. 30-Sep. 3, 2006, 1-4244-0033-3/06/$20.00 © 2006 IEEE, pp. 6129-6132.

* cited by examiner

MODELING NONLINEAR SYSTEMS

CROSS-REFERENCE TO RELATED APPLICATIONS

This application claims the priority of U.S. Provisional Application Ser. No. 60/942,520, filed on Jun. 7, 2007, the contents of which are incorporated herein by reference.

FEDERALLY SPONSORED RESEARCH OR DEVELOPMENT

This invention was made with government support under Grant No. N66001-02-C-8057, awarded by The Defense Advanced Research Projects Agency DARPA, Grant No. P41 EB001978, awarded by the National Institute of Biomedical Imaging and BioEngineering, and/or Grant No. EEC-0310723, awarded by the National Science Foundation. The government has certain right in the invention.

BACKGROUND

This disclosure relates to modeling of nonlinear systems, such as nonlinear Multiple-Input, Multiple-Output systems.

Nonlinear system are systems that do not satisfy the superposition principle, i.e., variables that are to be determined cannot be written as a linear sum of independent components. As a result, traditional linear modeling approaches are often insufficient to express the relationships between system components and variables. Examples of nonlinear systems include the weather, fluid dynamics, nonlinear optical systems, and a variety of other systems.

SUMMARY

Systems and techniques, including machine-readable instructions, for modeling of nonlinear systems are described.

In one aspect, an apparatus for modeling a non-linear system is described. The apparatus includes a collection of two or more inputs configured and arranged to receive input signals, a collection of two or more outputs configured and arranged to output output signals, a processing unit configured to transform the input signals into the output signals, wherein the transformation is non-linear, and a data storage that stores characteristics of the non-linear transformation. The characteristics of the non-linear transformation include at least one of a first characterization of an impact of a first input signal received on a first of the inputs on an effect that a second input signal received on a second of the inputs has on an output signal output by a first of the outputs and a second characterization of an impact of the first input signal on an effect that a third input signal on the first of the inputs has on the output signal output by a first of the outputs.

This and other aspects can include one or more of the following features. The characteristics can be values that characterize the non-linear transformation in a multiple input single output model expressed as $$w = u(k, x) + a(h, y) + n(\sigma), \quad y = \begin{cases} 0 & \text{when } w < \theta \\ 1 & \text{when } w \geq \theta \end{cases}.$$

The processing unit can include a stochastic noise source that stochastically changes the transformation of the input signals into the output signals and/or a threshold configured to discretize the output signals. The first characterization can be a feedforward crosskernel. At least one of the first characterization and the second characterization can be a decaying feedforward kernel. For example, the decaying feedforward kernel can be a Laguerre kernel.

The data storage can store both the first characterization and the second characterization. The characteristics stored by the data storage further can include a feedback kernel. The feedback kernel can include a negative phase followed by a positive overshoot. The characteristics stored by the data storage can also include a third characterization of a linear transformation of the first input signal received on the first of the inputs into the output signal output by the first of the outputs and/or a collection of third order self-kernels.

The apparatus can be an implantable neural stimulator. The collection of two or more inputs can be a collection of input electrodes. The collection of two or more outputs can be a collection of output electrodes.

In another aspect, a method for modeling a non-linear system includes receiving machine-readable information characterizing a collection of two or more inputs and two or more outputs from a multiple input, multiple output nonlinear system, and estimating a collection of parameters for modeling the non-linear system by considering the multiple input, multiple output non-linear system to be a collection of multiple input, single output systems.

This and other aspects can include one or more of the following features. The collection of parameters can be estimated by estimating a parameter characterizing an impact of a first input signal received on a first of the multiple inputs on an effect that a second input signal received on a second of the multiple inputs has on an output signal output by a first of the multiple outputs and/or by estimating a parameter characterizing an impact of a first input signal received on a first of the multiple inputs on an effect that a second input signal received on the first of the multiple inputs has on an output signal output by a first of the multiple outputs.

The collection of parameters can be estimated by estimating a parameter characterizing a linear transformation of a first input signal received on a first of the multiple inputs on an output signal output by a first of the multiple outputs.

The collection of parameters can be estimated by estimating a collection of kernels. For example, a collection of feedforward crosskernels and/or a collection of feedforward self-kernels can be estimated. The collection of parameters can be estimated by modeling at least some of the multiple input, single output systems as including a stochastic noise source.

The method can include receiving a collection of input signals and transforming the input signals into a collection of output signals based on the estimating parameters for modeling the non-linear system. The method can also include outputting a collection of output signals based of the estimated collection of parameters. For example, deep tissue stimulation can be performed with the collection of output signals.

In another aspect, an apparatus for modeling a non-linear system is described. The apparatus includes a collection of two or more inputs configured and arranged to receive input signals, a collection of two or more outputs configured and arranged to output output signals, a processing unit configured to transform the input signals into the output signals, wherein the transformation is non-linear and treats the nonlinear system as a collection of multiple input, single output non-linear systems, and a data storage that stores characteristics of the transformation.

This and other aspects can include one or more of the following features. A first characteristic of the non-linear transformation stored by the data storage can be a characterization of an impact of a first input signal received on a first of the inputs on an effect that a second input signal received on a second of the inputs has on an output signal output by a first of the outputs.

A first characteristic of the non-linear transformation stored by the data storage can be a first characterization of an impact of a first input signal on a first of the inputs on an effect that a second input signal on the first of the inputs has on an output signal output by a first of the outputs.

The processing unit can include a stochastic noise source that stochastically changes the transformation of the input signals into the output signals and/or a threshold to discretize the output signals. The characteristics can include values that characterize the non-linear transformation in a multiple input single output model expressed as $$w = u(k, x) + a(h, y) + n(\sigma), \quad y = \begin{cases} 0 & \text{when } w < \theta \\ 1 & \text{when } w \geq \theta \end{cases}.$$

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
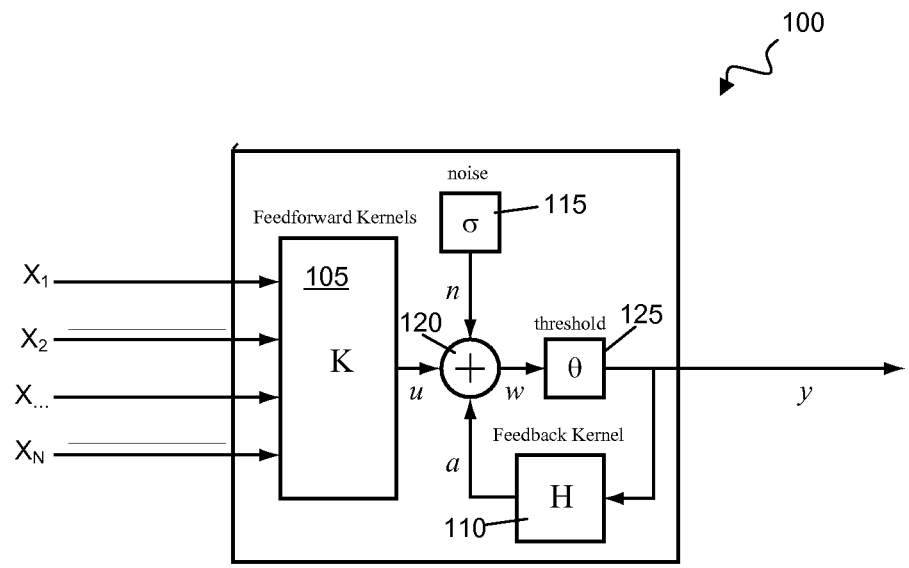
FIG. 1 is a schematic representation of a multiple input/single output (MISO) model.

FIG. 1 is a schematic representation of a configuration of a model of a nonlinear system, namely, the configuration of a multiple input/single output (MISO) model 100. MISO model 100 includes a collection of feedforward kernels 105, one or more feedback kernels 110, a stochastic noise source 115, a summer 120, and a threshold 125. MISO model 100 models the impact of a collection of inputs $X_1, X_2, X \ldots, X_N$ on a single output Y.

Feedforward kernels 105 are kernels that characterize the anticipated effect that inputs $X_1, X_2, X \ldots, X_N$ together or individually exert on an intermediate u. These kernels (i.e., Volterra kernels) are mathematical descriptors of nonlinear dynamics. In the Volterra modeling approach, one or more outputs of a nonlinear, time invariant and finite memory system are expressed in terms of a functional expansion that represents a hierarchy of possible interactions among the past and present values of one or more inputs as they affect the outputs. These interactions are mathematically represented by kernel functions of various orders, corresponding to progressively higher order temporal interactions of the input events.

As discussed further below, feedforward kernels 105 can include both self-kernels and cross-kernels of various orders. Self-kernels characterize the effects that each input $X_1, X_2, X \ldots, X_N$ exerts on an intermediate variable u. Cross-kernels characterize the effects that inputs $X_1, X_2, X \ldots, X_N$ exert on the impact of other inputs $X_1, X_2, X \ldots, X_N$ on intermediate variable u.

Feedback kernels 110 are one or more kernels that characterize the anticipated effect that output Y exerts on an intermediate variable a. Stochastic noise source 115 embodies the impact of various stochastic processes in and/or on a nonlinear system. For example, stochastic noise source 115 can be modeled as a Gaussian white noise source with a standard deviation σ. This impact is represented as an intermediate variable n.

Summer 120 receives intermediates intermediate variables u, a, and n and sums them to output an intermediate variable w. Intermediate variable w is input into threshold 125 and compared with a threshold value θ. Output Y is changed depending on the results of the comparison between intermediate variable w and threshold value θ.

As discussed further below, MISO model 100 can be used to model the impact of inputs $X_1, X_2, X \ldots, X_N$ on a single output Y in non-linear systems such as neural tissue. In such implementations, each input $X_1, X_2, X \ldots, X_N$ is a train of discrete pulses that represent the receipt of action potentials (spikes) on an electrode implanted in neural tissue. Further, output Y is also a spike train. The pulses can be triggered when intermediate w exceeds threshold value θ. Output Y can be set to zero, to a noisy black level, or to another value when intermediate variable w does not exceed threshold value θ. Feedforward kernels 105 can also be selected in light of prior understanding of the physiological behavior of action potentials in neural tissue. For example, as discussed further below, decaying kernels such as Laguerre kernels can be selected when modeling nonlinear behavior in neural tissue.

Figure 2:
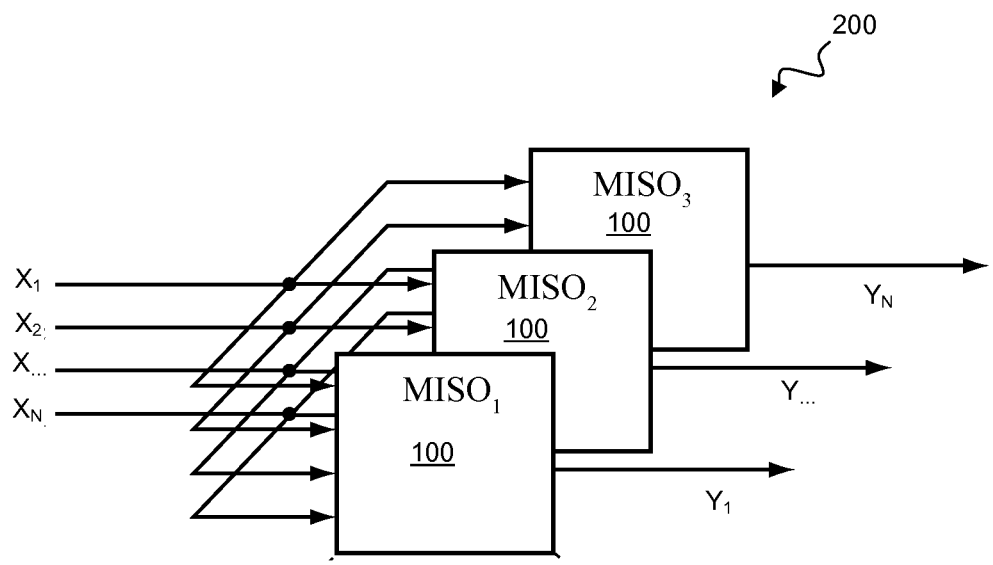
FIG. 2 is a schematic representation of the configuration of a multiple input/multiple output (MIMO) model.

FIG. 2 is a schematic representation of the configuration of another model of a nonlinear system, namely, the configuration of a multiple input/multiple output (MIMO) model 200. MIMO model 200 includes a collection of MISO models 100 that each models the impact of inputs $X_1, X_2, X \ldots, X_N$ on an output $Y_1, Y \ldots, Y_N$. MIMO model 200 thus treats a non-linear system as a collection of multiple input, single output non-linear systems.

As discussed further below, MIMO model 200 can be used to model the impact of inputs $X_1, X_2, X \ldots, X_N$ on outputs $Y_1, Y \ldots, Y_N$ in non-linear systems such as neural tissue. In such implementations, each input $X_1, X_2, X \ldots, X_N$ can be a spike train of one or more discrete pulses that reflect the impact of action potentials on an electrode implanted in neural tissue. Further, each output $Y_1, Y \ldots, Y_N$ can be a spike train of one or more discrete pulses. The pulses can be triggered when the corresponding intermediate variable w exceeds the corresponding threshold value θ. Outputs Y can be set to zero, to a noisy black level, or to another value when the corresponding intermediate variable w does not exceed the corresponding threshold value θ.

In both models 100, 200 (FIGS. 1, 2), MISO model 100 can thus be expressed using the following equations:

$$w = u(k,x) + a(h,y) + n(\sigma), \quad \text{Equation 1}$$

$$y = \begin{cases} 0 & \text{when } w < \theta \\ 1 & \text{when } w \geq \theta \end{cases} \quad \text{Equation 2}$$

When modeling systems such as neural tissue, the inputs x can represent input spike trains and outputs y can represent output spike trains. The hidden intermediate variable w can represent the pre-threshold potential of the output neurons. Variable w is equal to the summation of three components, namely, synaptic potential u caused by input spike trains, the output spike-triggered after-potential a, and a Gaussian white noise n with standard deviation σ. The noise term models both intrinsic noise of the output neuron and the contribution from unobserved inputs. When w crosses threshold θ, an output spike is generated and a feedback after-potential (a) is triggered and then added to w. Feedforward kernels k describe the transformation from x to u. The feedback kernel h describes the transformation from y to a.

The intermediate variable u can be expressed as a Volterra functional series of x, e.g., as:

$$u(t) = k_0 + \sum_{n=1}^{N} \sum_{\tau=0}^{M_k} k_1^{(n)}(\tau) x_n(t-\tau) + \quad \text{Equation 3}$$

$$\sum_{n=1}^{N} \sum_{\tau_1=0}^{M_k} \sum_{\tau_2=0}^{M_k} k_{2s}^{(n)}(\tau_1, \tau_2) x_n(t-\tau_1) x_n(t-\tau_2) +$$

-continued $$\sum_{n_1=1}^{N} \sum_{n_2=1}^{n_1-1} \sum_{\tau_1=0}^{M_k} \sum_{\tau_2=0}^{M_k} k_{2x}^{(n_1,n_2)}(\tau_1, \tau_2) x_{n_1}(t-\tau_1) x_{n_2}(t-\tau_2) +$$

$$\sum_{n=1}^{N} \sum_{\tau_1=0}^{M_k} \sum_{\tau_2=0}^{M_k} \sum_{\tau_3=0}^{M_k} k_{3s}^{(n)}(\tau_1, \tau_2, \tau_3)$$

$$x_n(t-\tau_1) x_n(t-\tau_2) x_n(t-\tau_3) + \ldots$$

The zeroth order kernel, $k_0$, is the value of u when the input is absent. First order kernels, $k_1^{(n)}$, describe the linear relation between the $n^{th}$ input $x_n$ and u. Second and third order self-kernels, $k_{2s}^{(n)}$ and $k_{3s}^{(n)}$, describe the $2^{nd}$ and $3^{rd}$ order non-linear relation between the $n^{th}$ input $x_n$ and u, respectively. Second order cross-kernels $k_{2x}^{(n_1,n_2)}$ describe the $2^{nd}$ order nonlinear interactions between each unique pair of inputs ($x_{n_1}$ and $x_{n_2}$) as they affect u. N is the number of inputs. $M_k$ denotes the memory length of the feedforward process. Higher order kernels, e.g., $3^{rd}$ order cross-kernels and $4^{th}$ order kernels, can also be calculated as needed.

The feedback intermediate variable a can be expressed as:

$$a(t) = \sum_{\tau=1}^{M_h} h(\tau) y(t-\tau), \quad \text{Equation 4}$$

where h is the linear feedback kernel. $M_h$ is the memory of the feedback process.

In order to reduce the number of open parameters to be estimated, both k and h can be expanded with orthonormal Laguerre basis functions b:

$$b_j(\tau) = \begin{cases} (-1)^\tau \alpha^{(j-\tau)/2}(1-\alpha)^{1/2} \sum_{k=0}^{\tau} (-1)^k \binom{\tau}{k}\binom{j}{k} \alpha^{\tau-k}(1-\alpha)^k & (0 \leq \tau < j) \\ (-1)^j \alpha^{(\tau-j)/2}(1-\alpha)^{1/2} \sum_{k=0}^{j} (-1)^k \binom{\tau}{k}\binom{j}{k} \alpha^{j-k}(1-\alpha)^k & (j \leq \tau \leq M) \end{cases}, \quad \text{Equation 5}$$

with input and output spike trains x and y convolved with b:

$$v_j^{(n)}(t) = \sum_{\tau=0}^{M_k} b_j(\tau) x_n(t-\tau), \quad v_j^{(h)}(t) = \sum_{\tau=1}^{M_h} b_j(\tau) y(t-\tau). \quad \text{Equation 6}$$

The intermediate variables u and a can be rewritten into:

$$u(t) = c_0 + \sum_{n=1}^{N} \sum_{j=1}^{L} c_1^{(n)}(j) v_j^{(n)}(t) + \quad \text{Equation 7}$$

$$\sum_{n=1}^{N} \sum_{j_1=1}^{L} \sum_{j_2=1}^{j_1} c_{2s}^{(n)}(j_1, j_2) v_{j_1}^{(n)}(t) v_{j_2}^{(n)}(t) +$$

$$\sum_{n_1=1}^{N} \sum_{n_2=1}^{n_1-1} \sum_{j_1=0}^{L} \sum_{j_2=0}^{L} c_{2x}^{(n_1,n_2)}(j_1, j_2) v_{j_1}^{(n)}(t) v_{j_2}^{(n)}(t) +$$

$$\sum_{n=1}^{N} \sum_{j_1=1}^{L} \sum_{j_2=1}^{j_1} \sum_{j_3=1}^{j_2} c_{3s}^{(n)}(j_1, j_2, j_3) v_{j_1}^{n}(t) v_{j_2}^{n}(t) v_{j_3}^{n}(t) + \ldots$$

-continued $$a(t) = \sum_{j=1}^{L} c_h(j) v_j^{(h)}(t).$$ Equation 8

The coefficients $c_1^{(n)}$, $c_{2s}^{(n)}$, $c_{2x}^{(n_1,n_2)}$, $c_{3s}^{(n)}$, and $c_h$ are the Laguerre expansion coefficients of $k_1^{(n)}$, $k_{2s}^{(n)}$, $k_{2x}^{(n_1,n_2)}$, $k_{3s}^{(n)}$, and h, respectively ($C_0$ is simply equal to $k_0$). Since the number of basis functions (L) can be made much smaller than the memory length ($M_k$ and $M_h$), the number of open parameters can be reduced by such an expansion.

In some implementations, the configurations of models 100, 200 can be selected and/or tailored according to the physical properties of the nonlinear systems being modeled. For example, models 100, 200 can be selected and/or tailored to model the propagation of nerve impulses inside a brain, such as inside the hippocampus.

Models 100, 200 can thus be physiologically plausible and used to predict an output spatio-temporal pattern of action potential events as a function of an input spatio-temporal pattern of action potential events for a synaptically connected population of neurons, e.g., consistent with the spatio-temporal pattern structure of the hippocampus to reflect transformations of inputs from multiple CA3 neurons to a given CA1 neuron.

In some implementations, estimating each MIMO model 200 requires estimating first order kernels, second order self-kernels, second order cross-kernels, and third order self-kernels for each of the MISO models 100 that form the MIMO model 200. In some implementations, each kernel model contains all the lower order terms, e.g., third order self-kernel model has first order, second order self and cross-terms, and thus is a superset of the lower order kernel models. In some implementations, the feedback kernel h can be limited to the linear case (1st order).

Figure 3:
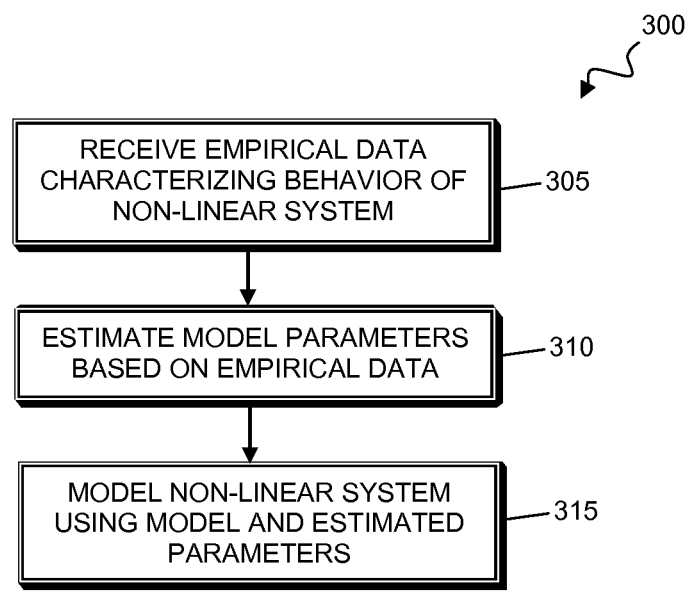
FIG. 3 is a flowchart of a process for modeling a nonlinear system.

FIG. 3 is a flowchart of a process 100 for modeling a nonlinear system using models such as models 100, 200. All or a portion of process 100 can be machine-implemented and performed by one or more data processing devices in accordance with the logic of one or more sets of machine-readable instructions. For example, all or a portion of process 100 can be performed by a computer that is performing operations in accordance with the logic of a set of software. The machine-readable instructions can be stored on one or more data storage devices, such as a magnetic disc, an optical disc, or other memory device.

The system performing process 300 can receive empirical data characterizing the behavior of a non-linear system at 305. For example, the empirical data can characterize the history of one or more inputs into the non-linear system as well as the history of one or more outputs from the non-linear system in response to those inputs. The system performing process 300 can receive the empirical data directly from the non-linear system or via one or more intermediaries that handles the data in some way. For example, intermediaries can filter, amplify, and/or store the data.

In some implementations, the empirical data can be obtained from an animal or other subject that captures desired behavior in the subject. For example, the desired behavior can be the behavior of a particular neural tissue that is deemed to be normal or not diseased.

The system performing process 300 can estimate parameters of a model based on the received input/output data at 310. For example, the number and types of model parameters, as well as the values of model parameters, can be estimated. In some implementations, the estimates can be based on the closeness of the fit between a model using the estimated model parameters and the empirical data. In some implementations, a maximum-likelihood approach can be used to estimate model parameters.

In some implementations, the estimated parameters can be stored in a digital library of estimated parameters. For example, the system can perform process 300 to estimate parameters that capture desired behavior in a collection of different neural tissues.

The system performing process 300 can model a non-linear system using the model and the estimated parameters at 315. The same non-linear system whose behavior is characterized by the received empirical data or a different non-linear system altogether can be modeled by the system performing process 300.

In one implementation, system performing process 300 can estimate parameters of a model based using recorded input and output spike trains x and y and a maximum-likelihood method. In particular, the log likelihood function L can be expressed as:

$$L(y \mid x, k, h, \sigma, \theta) =$$ Equation 9

$$\ln \prod_{t=0}^{T} P(y \mid x, k, h, \sigma, \theta) = \sum_{t=0}^{T} \ln P(y \mid x, k, h, \sigma, \theta),$$

where $$P(y \mid x, k, h, \sigma, \theta) =$$ Equation 10

$$\begin{cases} Prob(w \geq \theta \mid x, k, h, \sigma, \theta) & \text{when } y = 1 \\ Prob(w < \theta \mid x, k, h, \sigma, \theta) & \text{when } z = 1 \end{cases}.$$

P can be calculated using error function (integral of Gaussian function):

$$P(t) = 0.5 - 0.5 A(t) \text{erf}\left(\frac{\theta - w(t)}{\sqrt{2}\,\sigma}\right),$$ Equation 11 where $\text{erf}(s)$ and $A(t)$ are defined as:

$$\text{erf}(s) = \frac{2}{\sqrt{\pi}} \int_0^s e^{-t^2} dt$$ Equation 12 and $$A(t) = \begin{cases} +1 & \text{when } y = 1 \\ -1 & \text{when } y = 0 \end{cases}.$$ Equation 13

The gradient of log-likelihood function against coefficients $c_i$ is given as:

$$G(i) = \frac{\partial L}{\partial c_i}$$ Equation 14

$$= \sum_{t=0}^{T} \frac{1}{P(t)} \cdot \frac{\partial P(t)}{\partial c_i}$$

-continued $$= \sum_{t=0}^{T} \frac{-1}{\sigma\sqrt{2\pi}P(t)} A(t) e^{-\frac{(\theta-w(t))^2}{2\sigma^2}} \cdot \frac{\partial w(t)}{\partial c_i},$$

where $$\frac{\partial w(t)}{\partial c_0} = 1,$$ Equation 15

$$\frac{\partial w(t)}{\partial c_1^{(n)}(j)} = v_j^{(n)}(t),$$ Equation 16

$$\frac{\partial w(t)}{\partial c_{2s}^{(n)}(j_1, j_2)} = v_{j_1}^{(n)}(t) v_{j_2}^{(n)}(t),$$ Equation 17

$$\frac{\partial w(t)}{\partial c_{2x}^{(n_1,n_2)}(j_1, j_2)} = v_{j_1}^{(n_1)}(t) v_{j_2}^{(n_2)}(t),$$ Equation 18

$$\frac{\partial w(t)}{\partial c_{3s}^{(n)}(j_1, j_2, j_3)} = v_{j_1}^{(n)}(t) v_{j_2}^{(n)}(t) v_{j_3}^{(n)}(t),$$ Equation 19 and $$\frac{\partial w(t)}{\partial c_h(j)} = v_j^{(h)}(t).$$ Equation 20

Hessian matrix H is given as:

$$H(i, j) = \frac{\partial^2 L}{\partial c_i \partial c_j}$$ Equation 21

$$= \sum_{t=0}^{T} \left( -\frac{1}{P(t)^2} \cdot \frac{\partial P(t)}{\partial c_i} \cdot \frac{\partial P(t)}{\partial c_j} + \frac{1}{P(t)} \cdot \frac{\partial^2 P(t)}{\partial c_i \partial c_j} \right)$$

$$= \sum_{t=0}^{T} \frac{-1}{\sigma\sqrt{2\pi}P(t)} A(t) e^{-\frac{(\theta-w(t))^2}{2\sigma^2}}$$ Equation 22

$$\left( \frac{1}{\sigma\sqrt{2\pi}P(t)} A(t) e^{-\frac{(\theta-w(t))^2}{2\sigma^2}} + \frac{\theta-w(t)}{\sigma^2} \right) \cdot$$

$$\frac{\partial w(t)}{\partial c_i} \cdot \frac{\partial w(t)}{\partial c_j}.$$

Variables $c_1^{(n)}$, $c_{2s}^{(n)}$, $c_{2x}^{(n_1,n_2)}$, $c_{3s}^{(n)}$, $c_h$, as well as the term $\theta - c_0$ which represents the distance between the threshold and the baseline value of w, can be arbitrarily scaled without influencing the relation between x and y. Furthermore, $\theta$ and $c_0$ also can be shifted together. So without loss of generality, both $\theta$ and $\sigma$ can be set to unity value and only c's estimated. $\sigma$ is later restored and $\theta$ remains unity value. A variety of techniques can be used to maximize the likelihood function L and estimate c. For example, standard Newton nonlinear optimization methods and generalized linear model (GLM) fitting methods can be used to estimate c by maximizing the likelihood function L. As discussed in the Empirical Results section below, nearly identical results were obtained using these two methods, with the link function of GLM chosen to be the probit function, i.e., inverse cumulative distribution function of the normal distribution. Confidence bounds of kernel coefficients can also be estimated from the Hessian matrix.

The coefficients $\hat{c}$ and $\hat{\sigma}$ can be obtained from estimated Laguerre expansion coefficients, $\tilde{c}$, with a simple normalization procedure:

$$\hat{c}_0 = 0,$$ Equation 23

$$\hat{c}_0^{(n)} = \frac{\tilde{c}_1^{(n)}}{1 - \tilde{c}_1},$$ Equation 24

$$\hat{c}_{2s}^{(n)} = \frac{\tilde{c}_{2s}^{(n)}}{1 - \tilde{c}_0},$$ Equation 25

$$\hat{c}_{2x}^{(n_1,n_2)} = \frac{\tilde{c}_{2x}^{(n_1,n_2)}}{1 - \tilde{c}_0},$$ Equation 26

$$\hat{c}_{3s}^{(n)} = \frac{\tilde{c}_{3s}^{(n)}}{1 - \tilde{c}_0},$$ Equation 27

$$\hat{c}_h = \frac{\tilde{c}_h}{1 - \tilde{c}_0},$$ Equation 28 and $$\hat{\sigma} = \frac{1}{1 - \tilde{c}_0}.$$ Equation 29

Feedforward and feedback kernels then can be reconstructed as:

$$\hat{k}_0 = 0,$$ Equation 30

$$\hat{k}_1^{(n)}(\tau) = \sum_{j=1}^{L} \hat{c}_1^{(n)}(j) b_j(\tau),$$ Equation 31

$$\hat{k}_{2s}^{(n)}(\tau_1, \tau_2) =$$ Equation 32

$$\sum_{j_1=1}^{L} \sum_{j_2=1}^{j_1} \frac{\hat{c}_{2s}^{(n)}(j_1, j_2)}{2} (b_{j_1}(\tau_1) b_{j_2}(\tau_2) + b_{j_2}(\tau_1) b_{j_1}(\tau_2)),$$

$$\hat{k}_{2x}^{(n_1,n_2)}(\tau_1, \tau_2) = \sum_{j_1=1}^{L} \sum_{j_2=1}^{L} \hat{c}_{2x}^{(n_1,n_2)}(j_1, j_2) b_{j_1}(\tau_1) b_{j_2}(\tau_2),$$ Equation 33

$$\hat{k}_{3s}^{(n)}(\tau_1, \tau_2, \tau_3) = \sum_{j_1=1}^{L} \sum_{j_2=1}^{j_1} \sum_{j_3=1}^{j_2} \frac{\hat{c}_{3s}^{(n)}(j_1, j_2, j_3)}{6}$$ Equation 34

$$\begin{pmatrix} b_{j_1}(\tau_1) b_{j_2}(\tau_2) b_{j_3}(\tau_3) + b_{j_1}(\tau_1) b_{j_3}(\tau_2) b_{j_2}(\tau_3) + \\ b_{j_2}(\tau_1) b_{j_1}(\tau_2) b_{j_3}(\tau_3) + b_{j_2}(\tau_1) b_{j_3}(\tau_2) b_{j_1}(\tau_3) + \\ b_{j_3}(\tau_1) b_{j_1}(\tau_2) b_{j_2}(\tau_3) + b_{j_3}(\tau_1) b_{j_2}(\tau_2) b_{j_1}(\tau_3) \end{pmatrix},$$

and $$\hat{h}(\tau) = \sum_{j=1}^{L} \hat{c}_h(j) b_j(\tau).$$ Equation 35

Threshold $\theta$ is equal to one in this normalized representation.

In some implementations, a model and estimated parameters can be validated. For example, the model and estimated parameters can be validated against new empirical data characterizing the behavior of the same non-linear system that was characterized by the empirical data received at 305 in process 300. In other implementations, the model and estimated parameters can be validated against the same the empirical data received at 305 in process 300.

When process 300 is used in conjunction with models such as models 100, 200 that include stochastic noise terms, the behavior of the model is itself generally also stochastic and not identical for a given set of inputs. Such behavior makes direct comparison, e.g., mean-square error, between empirically-recorded outputs y and predicted outputs ŷ difficult. Indirect methods can be used instead of direct comparisons.

In one implementation, a model and estimated parameters can be validated by evaluating a firing probability predicted by the model with the recorded output spike train. According to the time-rescaling theorem, an accurate model should generate a conditional firing intensity function that can transform the recorded output spike train into a Poisson process with unit rate. The conditional firing intensity function $P_f$ can be given as:

$$P_f(t) = 0.5 - 0.5 \text{erf}\left(\frac{\theta - w(t)}{\sqrt{2}\,\sigma}\right).$$

Equation 36

This $P_f$ is different from the P discussed above in the likelihood function which represents the probability of generating a spike at a certain time t. In contrast, $P_f$ denotes the probability of generating the recorded output y at time t. Let $t_i$ denote the time of the $i^{th}$ spike in y, then according to the time-rescaling theorem:

$$D(t_i) = \sum_{t=0}^{t_i} P_f(t),$$

Equation 37 should be a Poisson process with unit rate and its intervals, $$\tau_f(i) = D(t_i) - D(t_{i-1}) = \sum_{t=t_{i-1}+1}^{t_i} P_f(t),$$

Equation 38 are independent exponential random variables with unitary mean. By making the further transformation $$z(i) = 1 - e^{-\tau_f(i)},$$

Equation 39 then z are independent uniform random variables on the interval (0, 1).

The model goodness-of-fit then can be assessed with a Kolmogorov-Smirnov (KS) test, in which z are ordered from the smallest to the largest and then plotted against the cumulative distribution function of the uniform density defined as:

$$\tilde{z}(i) = \frac{i - 0.5}{n},$$

Equation 40 where i=1, . . . , n and n is the total number of output spikes. If the model is correct, all points should lie on the 45-degree line of the KS plot within the 95% confidence bounds given as $\tilde{z}(i) \pm 1.36/\sqrt{n}$.

In other implementations, the similarity between the recorded output spike train y and the predicted output spike train ŷ can be quantified after a smoothing process. ŷ can be predicted through simulation: u can be calculated with input spike trains x and the estimated feedforward kernels $\hat{k}$. This forms the deterministic part of w. Then, a Gaussian random sequence with standard deviation $\hat{\sigma}$ is generated and added to u to obtain w. This operation includes the stochastic component into w. At time t, if the value of w is higher than the threshold ($\theta$=1), a spike is added to ŷ and a feedback component a is added to the future values of w. The calculation then repeats for time t+1 with updated w until it reaches the end of the trace. Discrete signals ŷ and y then can be smoothed to continuous signals $\hat{y}_{\sigma_g}$ and $y_{\sigma_g}$ by convolution with a Gaussian kernel function having the standard deviation $\sigma_g$. Correlation (similarity) coefficient r can be calculated as:

$$r(\sigma_g) = \frac{\sum_{t=0}^{T} \hat{y}_{\sigma_g}(t) y_{\sigma_g}(t)}{\sqrt{\left(\sum_{t=0}^{T} y_{\sigma_g}(t) y_{\sigma_g}(t)\right)\left(\sum_{t=0}^{T} \hat{y}_{\sigma_g}(t) \hat{y}_{\sigma_g}(t)\right)}}$$

Equation 41

Because $\hat{y}_{\sigma_g}$ and $y_{\sigma_g}$ are both positive vectors, r is a number between 0 and 1 that measures the similarity between ŷ and y as a function of the "smoothness parameter" $\sigma_g$. r can be interpreted as the cosine of the angle between vectors $\hat{y}_{\sigma_g}$ and $y_{\sigma_g}$. In the Empirical Results section below, $\sigma_g$ varies from 2 ms to 40 ms with a 2 ms resolution and, for a given $\sigma_g$, r was estimated with 32 trials of simulation of ŷ.

Empirical Results

Male Long-Evans rats were trained to criterion on a two-lever, spatial delayed-nonmatch-to-sample (DNMS) task with randomly occurring variable delay intervals. Animals performed the task by pressing (sample response) a single lever presented in one of the two positions in the sample phase (left or right). This event can be referred to as the "sample response." The lever was then retracted and the delay phase initiated. For the duration of the delay phase, the animal was required to nosepoke into a lighted device on the opposite wall. Following termination of the delay, the nosepoke light was extinguished, both levers were extended, and the animal was required to press the lever opposite to the sample lever. This act is called the "nonmatch response." If the correct lever were pressed, the animal was rewarded and the trial was completed.

Figure 4:
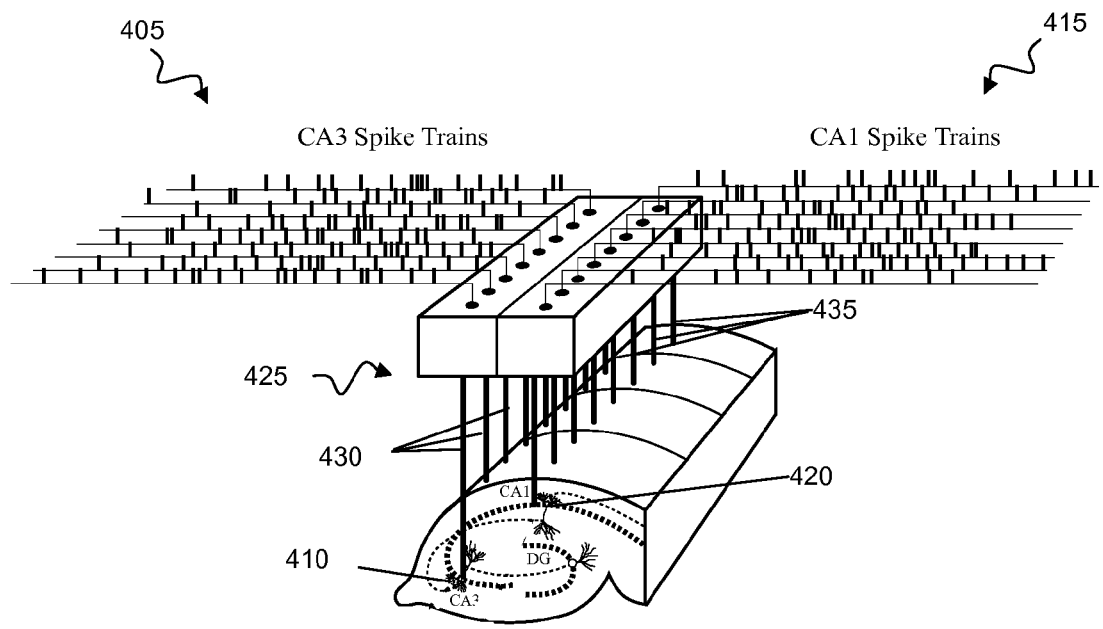
FIG. 4 is a schematic representation of the recording of spike trains from rat hippocampi and their correspondence with inputs and outputs in the models of FIGS. 1 and 2.

FIG. 4 is a schematic representation of the recording of spike trains from rat hippocampi and their correspondence with inputs $X_1, X_2, X \ldots, X_N$ and outputs $Y_1, Y \ldots, Y_N$ in models 100, 200. In particular, a collection 405 of spike trains in the hippocampal CA3 region 410 and a collection 415 of spike trains in the hippocampal CA1 region 420 were recorded using a multi-electrode array 425 while the rats performed the DNMS task. For each hemisphere of the brain, eight microwire electrodes 430 of array 425 were surgically implanted into CA3 region 410 and eight microwire electrodes 535 of array 425 were surgically implanted into CA1 region 420. Collection 405 was treated as inputs $X_1, X_2, X \ldots, X_N$ in models 100, 200. Collection 410 was treated as outputs $Y_1, Y \ldots, Y_N$ in model 200.

Each microwire electrode in array 425 had the capacity to record as many as four discriminable units. Spike and behavioral responses were digitized and time-stamped at a 25 μs resolution. Datasets from six rats were analyzed. Three sessions of recordings were selected from each rat. A session included approximately 90 successful DNMS tasks that each consisted of four behavioral events, i.e., right sample (RS), left sample (LS), right nonmatch (RN), and left nonmatch (LN).

Figure 5:
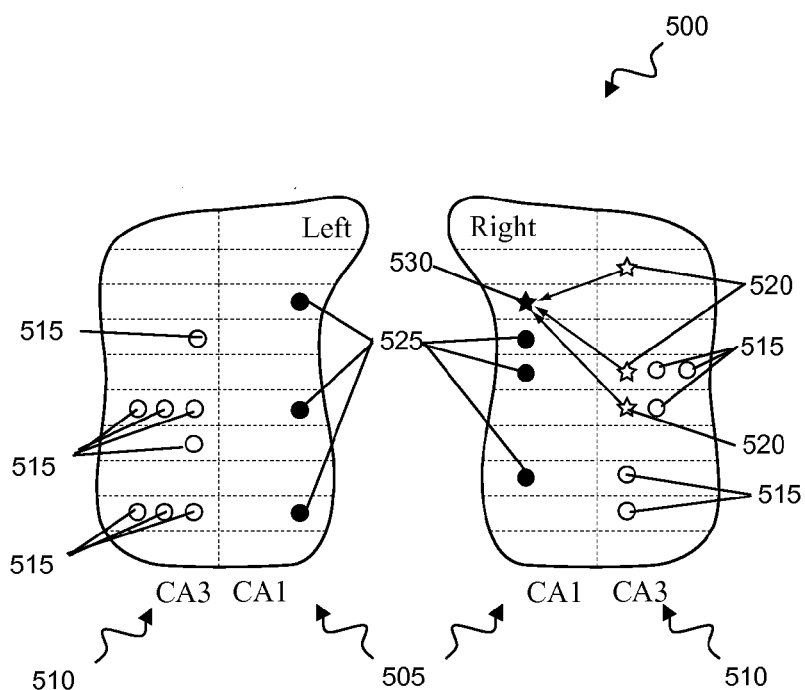
FIG. 5 is a schematic representation of a foldout map of the right and left hemispheres of the hippocampus.

FIG. 5 is a schematic representation of a foldout map 500 of the right and left hemispheres of the hippocampus, as well as an example positioning of the microwire electrodes in the hippocampus. Each hemisphere includes a CA1 region 505 and a CA3 region 510. The spatial positions of microwire electrodes in array 425 can be represented in the hippocampus on map 500 using symbols 515, 520, 525, 530. In particular, white symbols 515 can represent the positions of microwire electrodes treated as inputs $X_1, X_2, X \ldots, X_N$ in model 200. White symbols 520 can represent the positions of microwire electrodes treated as inputs $X_1, X_2, X \ldots, X_N$ in both models 100, 200. Black symbols 525 can represent the positions of microwire electrodes treated as outputs $Y_1, Y \ldots, Y_N$ in model 200. Black symbols 530 can represent the positions of microwire electrodes treated as outputs $Y_1, Y \ldots, Y_N$ in both models 100, 200. Thus, in the illustrated example, there are 16 inputs $X_1, X_2, X \ldots, X_N$ and seven outputs $Y_1, Y \ldots, Y_N$ in model 200 and three inputs $X_1, X_2, X \ldots, X_N$ and one output $Y_1, Y \ldots, Y_N$ in model 100.

Figure 6:
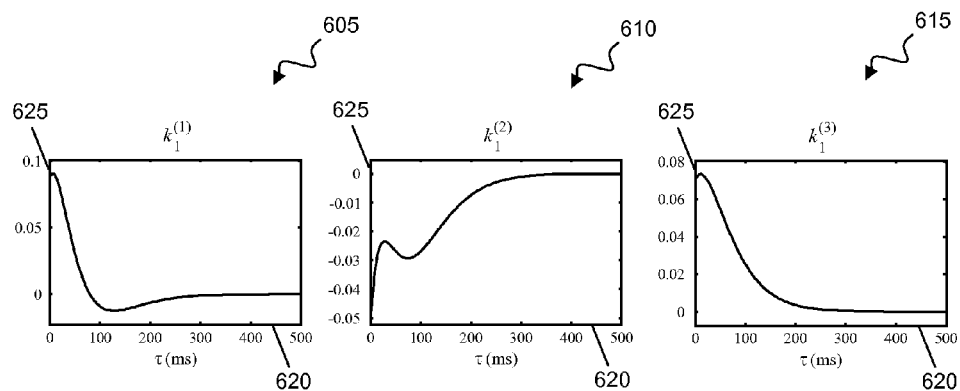
FIG. 6 is a collection of graphs that each illustrate feedforward kernels of a first order kernel model of a 3-input MISO dataset.

FIG. 6 is a collection of graphs 605, 610, 615 that each illustrate feedforward kernels of a first order kernel model of a 3-input MISO dataset. Graphs 605, 610, 615 each include an X-axis 620 and a Y-axis 625. Position along X-axes 620 reflects time ($\tau$) between a present time and a previous spike. Position along Y-axes 625 reflects the linear transformation of input spikes trains into the hidden intermediate variable u as 1st order kernels $k_1$. Kernels $k_1$ are vectors with length $M_k$.

Each graph 605, 610, 615 corresponds to a single input. The locations of the input and output neurons are shown as symbols 520, 530 in FIG. 5. The Gaussian noise standard deviation $\sigma$ is estimated to be 0.311.

Figure 7:
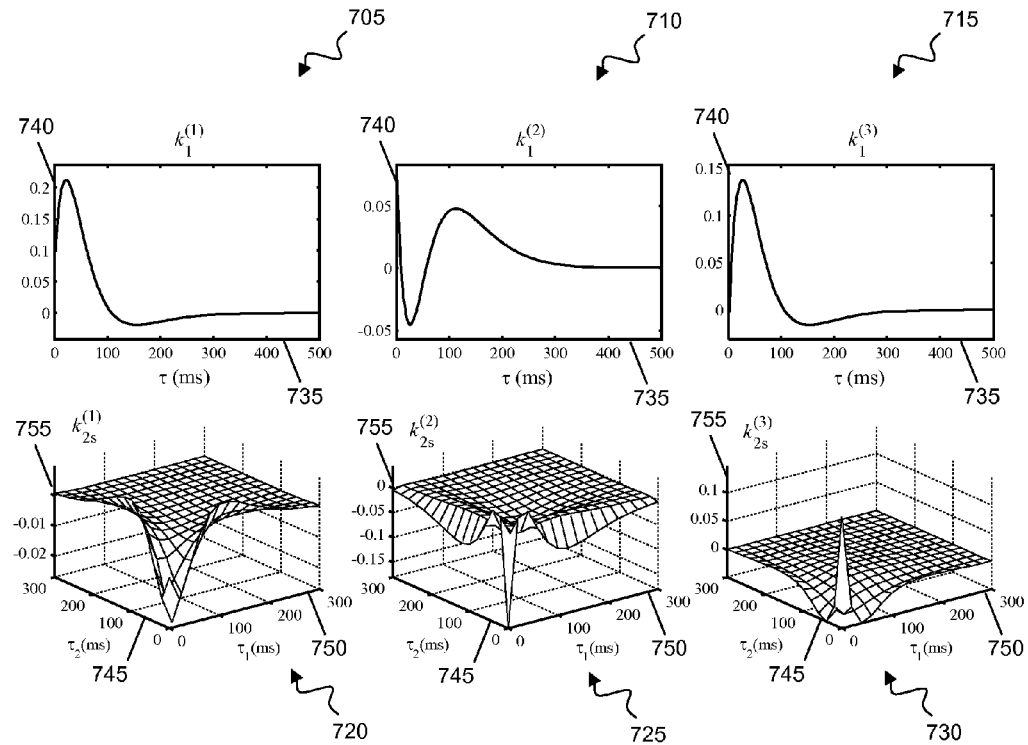
FIG. 7 is a collection of graphs that each illustrate feedforward kernels of a second order self-kernel model of a 3-input MISO dataset.

FIG. 7 is a collection of graphs 705, 710, 715, 720, 725, 730 that each illustrate feedforward kernels of a second order self-kernel model of a 3-input MISO dataset. Graphs 705, 710, 715 each include an X-axis 735 and a Y-axis 740. Position along X-axes 735 reflects time ($\tau$) between a present time and a previous spike. Position along Y-axes 740 reflects the linear transformation of input spikes trains into the hidden intermediate variable u as 1st order kernels $k_1$.

Graphs 720, 725, 730 each include a first axis 745, a second axis 750, and a third axis 755. Position along axes 745, 750 reflects time ($\tau$) between a present time and previous pairs of spikes of the same input ($\tau_1$ and $\tau_2$). Position along third axis 755 reflects the pair-wise nonlinear interaction between spikes of the same input $X_1, X_2, X \ldots, X_N$ as they affect the hidden intermediate variable u as second order self-kernels $k_2$. Kernels $k_{2s}$ are $M_k \times M_k$ symmetric matrixes.

Each graph 705, 710, 715, 720, 725, 730 corresponds to a single input. The locations of the input and output neurons are shown as symbols 520, 530 in FIG. 5. The Gaussian noise standard deviation $\sigma$ is estimated to be 0.298.

Figure 8:
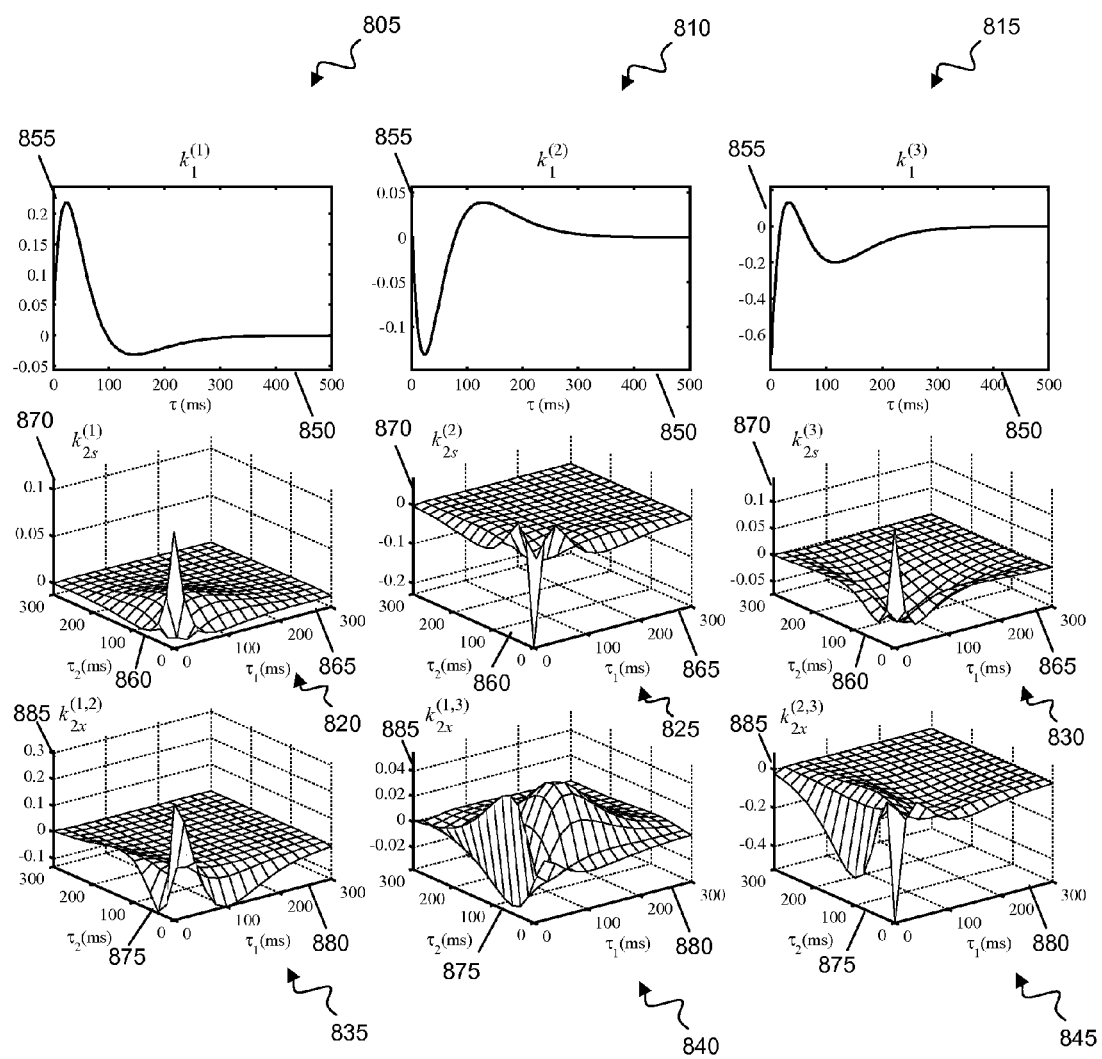
FIG. 8 is a collection of graphs that each illustrate feedforward kernels of a second order cross-kernel model of a 3-input MISO dataset.

FIG. 8 is a collection of graphs 805, 810, 815, 820, 825, 830, 835, 840, 845 that each illustrate feedforward kernels of a second order cross-kernel model of a 3-input MISO dataset. Graphs 805, 810, 815 each include an X-axis 850 and a Y-axis 855. Position along X-axes 850 reflects time ($\tau$) between a present time and a previous spike. Position along Y-axes 855 reflects the linear transformation of input spikes trains into the hidden intermediate variable u as 1st order kernels $k_1$.

Graphs 820, 825, 830 each include a first axis 860, a second axis 865, and a third axis 870. Position along axes 860, 865 reflects time ($\tau$) between a present time and previous pairs of spikes of the same input ($\tau_1$ and $\tau_2$). Position along third axis 870 reflects the pair-wise nonlinear interaction between spikes of the same input $X_1, X_2, X \ldots, X_N$ as they affect the hidden intermediate variable u as second order self-kernels $k_{2s}$. Kernels $k_{2s}$ are $M_k \times M_k$ symmetric matrixes.

Graphs 835, 840, 845 each include a first axis 875, a second axis 880, and a third axis 885. Position along axes 875, 880 reflects time ($\tau$) between a present time and previous pairs of spikes of the same input ($\tau_1$ and $\tau_2$). Position along third axis 885 reflects the pair-wise nonlinear interactions between spikes of different inputs $X_1, X_2, X \ldots, X_N$ as they affect the hidden intermediate variable u as second order cross-kernels $k_{2x}$. Kernels $k_{2x}$ are $M_k \times M_k$ asymmetric matrixes.

Each graph 805, 810, 815, 820, 825, 830, 835, 840, 845 corresponds to a single input. The locations of the input and output neurons are shown as symbols 520, 530 in FIG. 5. The Gaussian noise standard deviation $\sigma$ is estimated to be 0.295.

Figure 9:
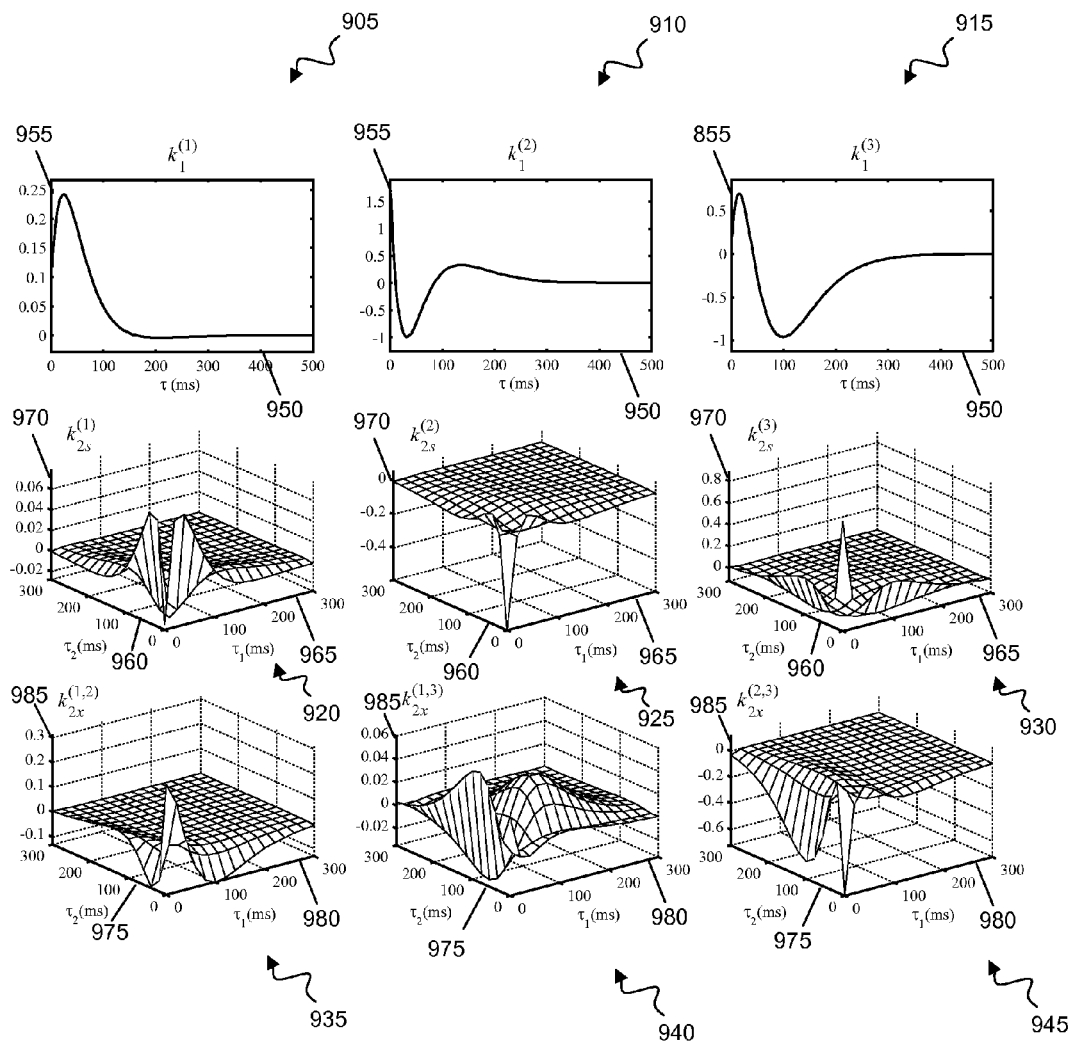
FIGS. 9 and 10 are a collection of graphs that each illustrate feedforward kernels of a third order cross-kernel model of a 3-input MISO dataset.
Figure 10:
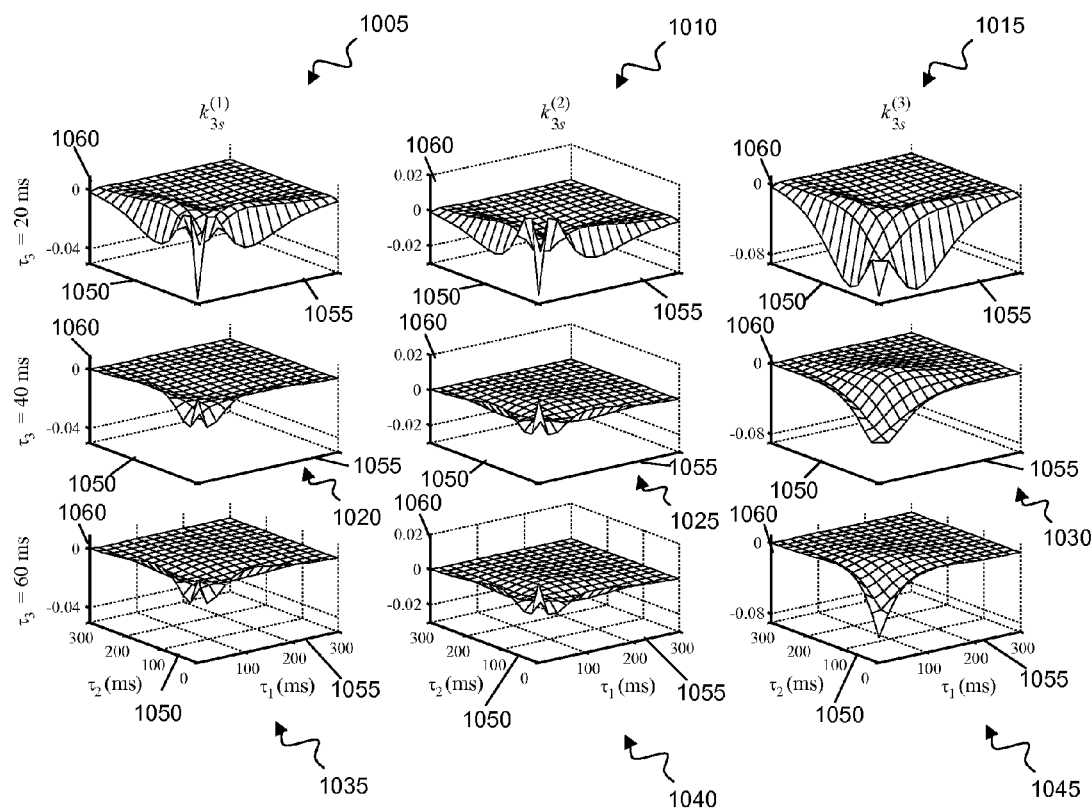

FIGS. 9 and 10 are a collection of graphs 905, 910, 915, 920, 925, 930, 935, 940, 945, 1005, 1010, 1015, 1020, 1025, 1030, 1035, 1040, 1045 that each illustrate feedforward kernels of a third order cross-kernel model of a 3-input MISO dataset. Graphs 905, 910, 915 each include an X-axis 950 and a Y-axis 955. Position along X-axes 950 reflects time ($\tau$) between a present time and a previous spike. Position along Y-axes 955 reflects the linear transformation of input spikes trains into the hidden intermediate variable u as 1st order kernels $k_1$.

Graphs 920, 925, 930 each include a first axis 960, a second axis 965, and a third axis 970. Position along axes 960, 965 reflects time ($\tau$) between a present time and previous pairs of spikes of the same input ($\tau_1$ and $\tau_2$). Position along third axis 970 reflects the pair-wise nonlinear interaction between spikes of the same input $X_1, X_2, X \ldots, X_N$ as they affect the hidden intermediate variable u as second order self-kernels $k_{2s}$. Kernels $k_{2s}$ are $M_k \times M_k$ symmetric matrixes.

Graphs 935, 940, 945 each include a first axis 975, a second axis 980, and a third axis 985. Position along axes 975, 980 reflects time ($\tau$) between a present time and previous pairs of spikes of the same input ($\tau_1$ and $\tau_2$). Position along third axis 985 reflects the pair-wise nonlinear interactions between spikes of different inputs $X_1, X_2, X \ldots, X_N$ as they affect the hidden intermediate variable u as second order cross-kernels $k_{2x}$. Kernels $k_{2x}$ are $M_k \times M_k$ asymmetric matrixes.

Graphs 1005, 1010, 1015, 1020, 1025, 1030, 1035, 1040, 1045 each include a first axis 1050, a second axis 1055, and a third axis 1060. Position along axes 1050, 1055 reflects time between a present time and previous pairs of spikes of the same input ($\tau_1$ and $\tau_2$).

Position along third axis 985 reflects the triplet-wise nonlinear interactions between spikes of the same input $X_1, X_2, X \ldots, X_N$ as they affect the hidden intermediate variable u as third order self-kernels $k_{3s}$. Kernels $k_{3s}$ are $M_k \times M_k \times M_k$ symmetric matrixes that have a four dimensional data structure and only "slices" of the third order kernels $k_{3s}$, or third order kernel for a selected "third" inter-spike interval, are shown. In particular, graphs 1005, 1010, 1015 are shown for a time lag ($\tau_3$) of 20 ms. Graphs 1020, 1025, 1030 are shown for a time lag ($\tau_3$) of 40 ms. Graphs 1035, 1040, 1045 are shown for a time lag ($\tau_3$) of 60 ms.

Each graph 805, 810, 815, 820, 825, 830, 835, 840, 845, 1005, 1010, 1015, 1020, 1025, 1030, 1035, 1040, 1045 corresponds to a single input. The locations of the input and output neurons are shown as symbols 520, 530 in FIG. 5. The Gaussian noise standard deviation $\sigma$ is estimated to be 0.295.

Figure 11:
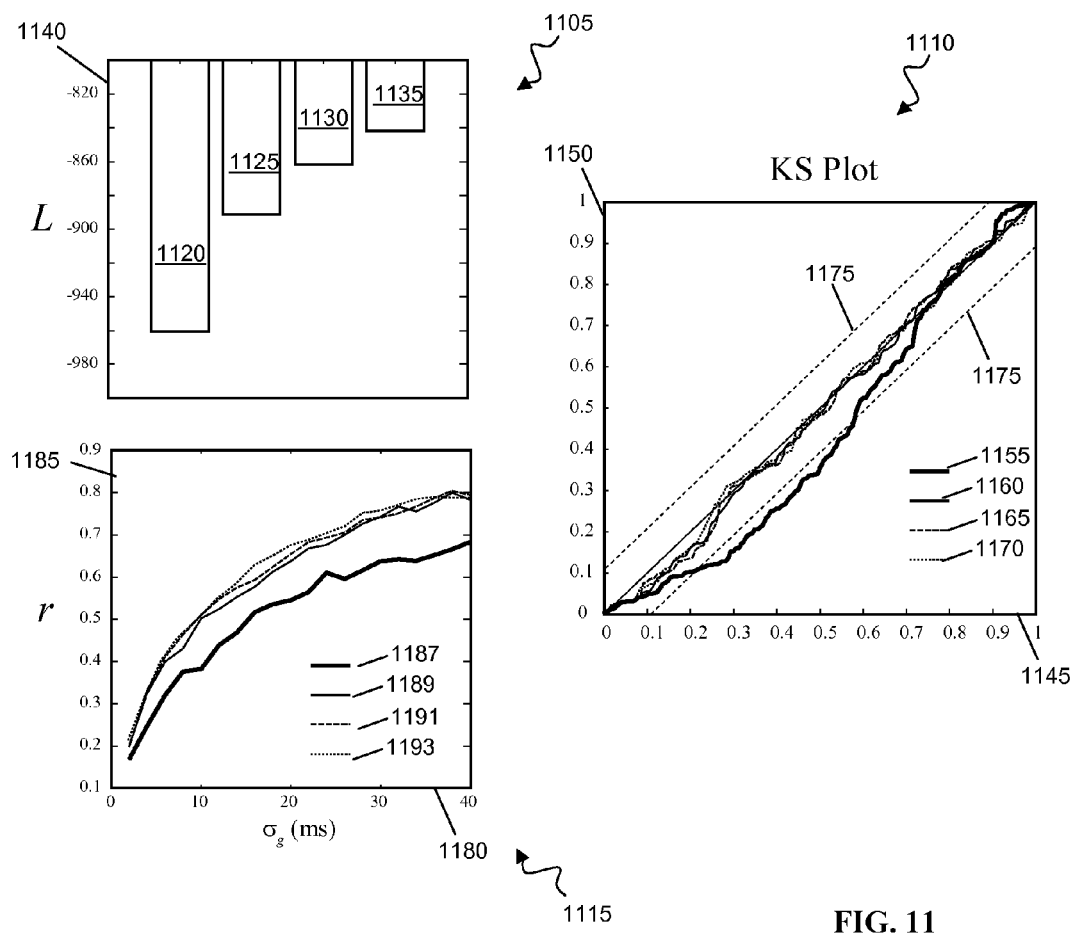
FIG. 11 is a collection of graphs that illustrate the fit to empirical data obtained using the kernels in FIGS. 6-10.

FIG. 11 is a collection of graphs 1105, 1110, 1115 that illustrate the fit to empirical data obtained using the kernels described above.

Graph 1105 includes bars 1120, 1125, 1130, 1135 plotted along a X-axis 1140. Position along X-axis 1140 reflects the Log Likelihood of an estimation provided by a collection of kernels in MISO model 100. Bar 1120 is the Log Likelihood of the estimation provided by the first order kernels shown in graphs 605, 610, 615 (FIG. 6). Bar 1125 is the Log Likelihood of the estimation provided by the second order self-kernels shown in graphs 705, 710, 715, 720, 725, 730 (FIG. 7). Bar 1130 is the Log Likelihood of the estimation provided by the second order cross-kernels shown in graphs 805, 810, 815,

820, 825, 830, 835, 840, 845 (FIG. 8). Bar 1135 is the Log Likelihood of the estimation provided by the third order self-kernels shown in graphs 905, 910, 915, 920, 925, 930, 935, 940, 945, 1005, 1010, 1015, 1020, 1025, 1030, 1035, 1040, 1045 (FIGS. 9 and 10).

Graph 1110 is a KS plot and includes an X-axis 1145 and a Y-axis 1150 that frame plots 1155, 1160, 1165, 1170. Position along X-axis 1145 reflects a distributional family parameter value (i.e., the value of the shape parameter) of a plot. Position along Y-axis 1150 reflects a Kolmogorov-Smirnov goodness of fit value for the given value of the shape parameter. Plot 1155 is the goodness of fit provided by the first order kernels shown in graphs 605, 610, 615 (FIG. 6). Plot 1160 is the goodness of fit provided by the second order self-kernels shown in graphs 705, 710, 715, 720, 725, 730 (FIG. 7). Plot 1165 is the goodness of fit provided by the second order cross-kernels shown in graphs 805, 810, 815, 820, 825, 830, 835, 840, 845 (FIG. 8). Plot 1170 is the goodness of fit provided by the third order self-kernels shown in graphs 905, 910, 915, 920, 925, 930, 935, 940, 945, 1005, 1010, 1015, 1020, 1025, 1030, 1035, 1040, 1045 (FIGS. 9 and 10). Graph 1110 also includes a pair of straight dashed lines 1175 that reflect the 95% confidence bounds.

Graph 1115 is a plot of correlation coefficients r and includes an X-axis 1180 and a Y-axis 1185 that frame plots 1187, 1189, 1191, 1193. Position along X-axis 1180 reflects the standard deviation $\sigma_g$ of a Gaussian kernel function, as per Equation 41. Position along Y-axis 1185 reflects a reflects the correlation coefficient, as per Equation 41. Plot 1187 is the correlation coefficient provided by the first order kernels shown in graphs 605, 610, 615 (FIG. 6). Plot 1189 is the correlation coefficient provided by the second order self-kernels shown in graphs 705, 710, 715, 720, 725, 730 (FIG. 7). Plot 1191 is the correlation coefficient provided by the second order cross-kernels shown in graphs 805, 810, 815, 820, 825, 830, 835, 840, 845 (FIG. 8). Plot 1193 is the correlation coefficient provided by the third order self-kernels shown in graphs 905, 910, 915, 920, 925, 930, 935, 940, 945, 1005, 1010, 1015, 1020, 1025, 1030, 1035, 1040, 1045 (FIGS. 9 and 10).

As can be seen, the KS plot in graph 1110 shows that the first order MISO model (i.e., plot 1155) displays a lack of fit for the lower half of quantiles (0.2-0.6), because in that range, model values lie outside the 95% confidence bounds. The maximum distance between model values and the 45-degree line is 0.157. A similar insufficiency of first order models was found in all MISO datasets (42 of 42).

Including the second order self-nonlinearities in the model significantly increased accuracy, as shown by the increase in log likelihood values from bar 1120 to bar 1125 in graph 1105. In the KS plot in graph 1110, plot 1160 for the second order self-kernels shows all values laying within the 95% confidence bounds 1175. The maximum distance between model values in plot 1160 and the 45-degree line is 0.063. Similar KS results were obtained in 85% of the MISO datasets (36 of 42).

In the KS plot in graph 1110, plot 1165 for the second order cross kernels shows all values laying within the 95% confidence bound 1175. The maximum distance between model values in plot 1165 and the 45-degree line is 0.061. All MISO datasets showed similar results (42 of 42).

Including the third order self-kernel in the model yields the highest log likelihood value, as shown by the highest log likelihood values in bar 1135 in graph 1105. In the KS plot in graph 1110, plot 1170 for the third order self kernels shows values that are the closest to the 45-degree line. The maximum distance between model values in plot 1170 and the 45-degree line is 0.056. All MISO datasets showed similar results (42 of 42).

Figure 12:
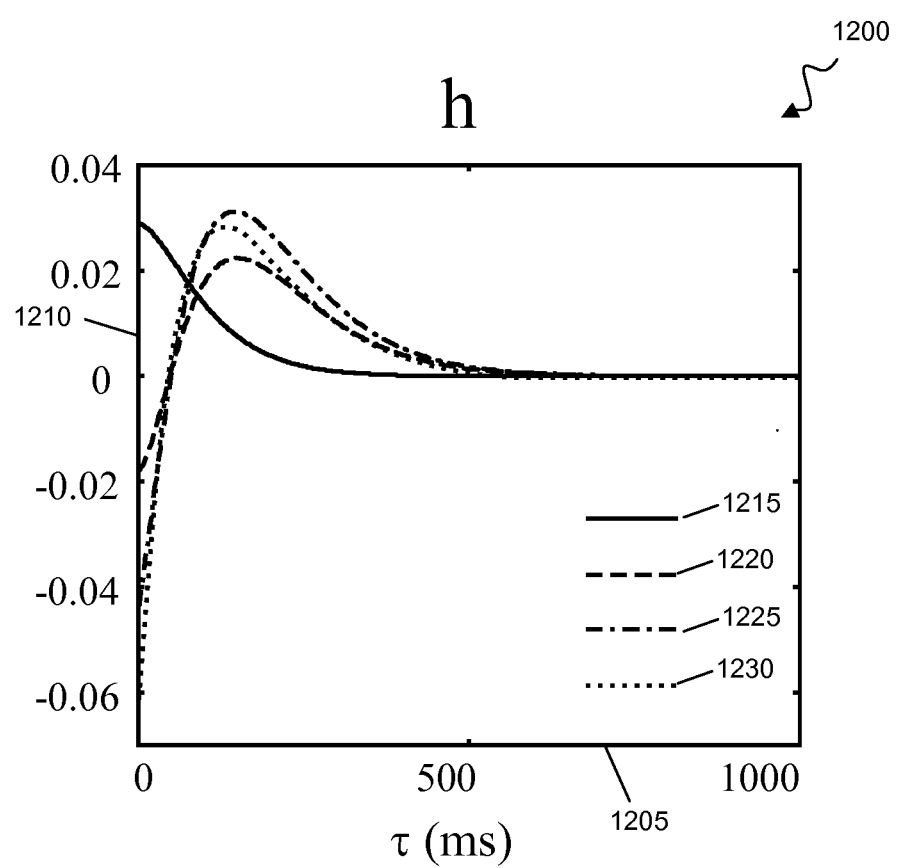
FIG. 12 is a graph that represents feedback kernels.

FIG. 12 is a graph 1200 that represents feedback kernels 110 (FIG. 1). Graph 1200 includes an X-axis 1205 and a Y-axis 1210 that frame plots 1215, 1220, 1225, 1230. Position along X-axis 1205 reflects the time interval (τ) between present time and previous output spikes. Position along Y-axis 1210 reflects a linear transformation of an output spike into an "after-potential."

Plot 1215 is the feedback kernel 110 estimated with first order feedforward kernels shown in graphs 605, 610, 615 (FIG. 6). Plot 1220 is the feedback kernel 110 estimated with the second order self-kernels shown in graphs 705, 710, 715, 720, 725, 730 (FIG. 7). Plot 1225 is the feedback kernel 110 estimated with the second order cross-kernels shown in graphs 805, 810, 815, 820, 825, 830, 835, 840, 845 (FIG. 8). Plot 1230 is the feedback kernel 110 estimated with the third order self-kernels shown in graphs 905, 910, 915, 920, 925, 930, 935, 940, 945, 1005, 1010, 1015, 1020, 1025, 1030, 1035, 1040, 1045 (FIGS. 9 and 10). As shown, plots 1215, 1220, 1225, 1230 all show a negative phase followed by a positive overshoot.

Figure 13:
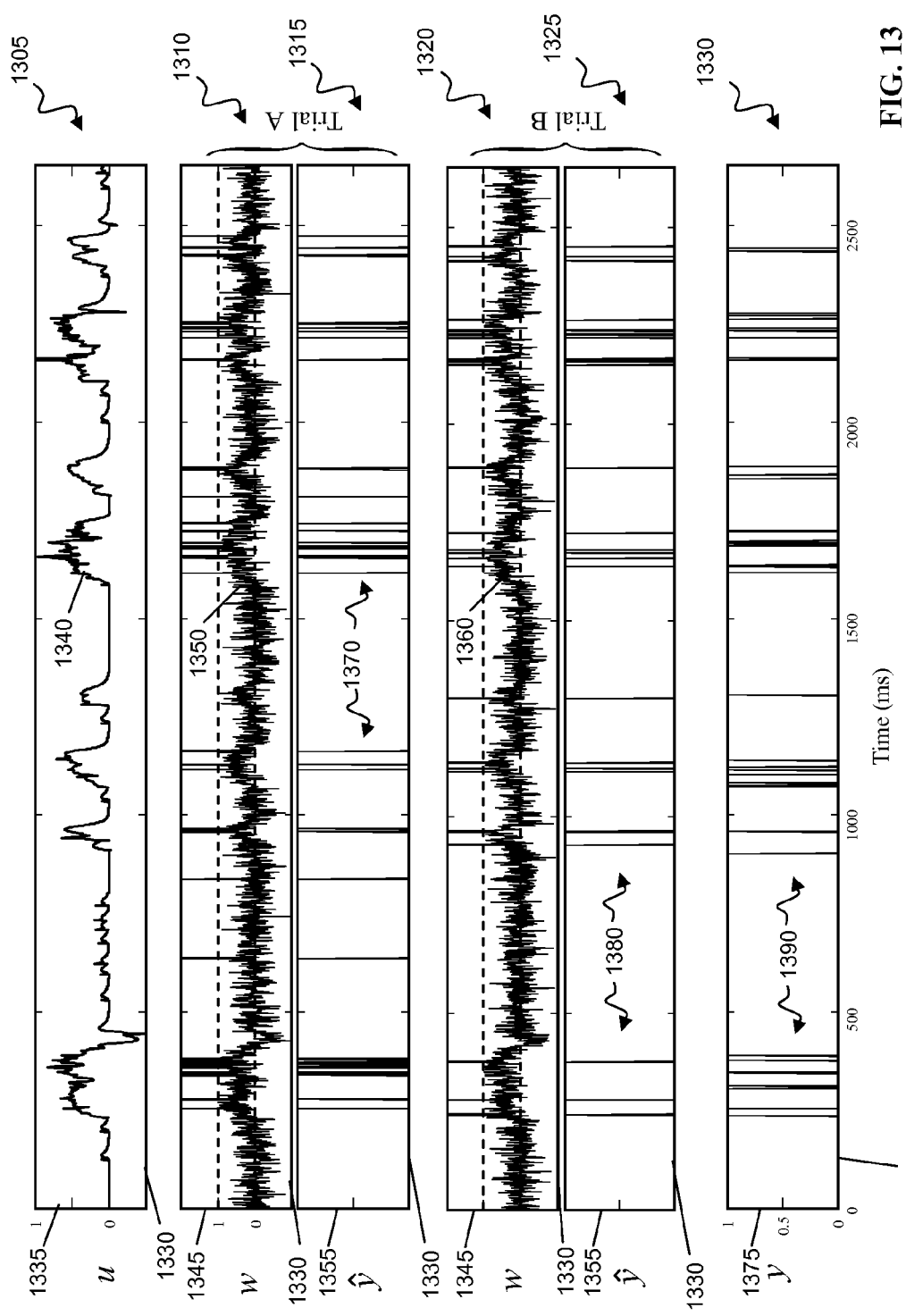
FIG. 13 is a collection of graphs that illustrate the use of the MISO model of FIG. 1 to simulate a single output for a given set of input spike trains.

FIG. 13 is a collection of graphs 1305, 1310, 1315, 1320, 1325 that illustrate the use of MISO model 100 to simulate a single output Y for a given set of input spike trains $X_1, X_2, X \ldots, X_N$. Graphs 1305, 1310, 1315, 1320, 1325 each include an X-axis 1330, the position along which reflects time.

Graph 1305 also includes a Y-axis 1335 that, together with X-axis 1330, frames a plot 1340. Position along Y-axis 1335 reflects value of the hidden intermediate variable u. Plot 1340 is the actual value of the hidden intermediate variable u as deterministically calculated using a set of input spike trains $X_1, X_2, X \ldots, X_N$ and feedforward kernels, as discussed above.

Graphs 1310, 1320 include Y-axes 1345 that, together with X-axis 1330, frame plots 1350, 1360. Position along Y-axes 1345 reflects the value of hidden intermediate variable w. Plot 1350 is the actual value of the hidden intermediate variable w in a first trial (i.e., "Trial A"). Plot 1360 is the actual value of the hidden intermediate variable w in a second trial (i.e., "Trial B"). As shown in FIG. 1, summer 120 in MISO model 100 sums a stochastic noise term as well as the other hidden variable to determine variable w. Plots 1350, 1360 are not identical in Trials A and B for this reason, despite the use of the same intermediate variable u being used in both.

Graphs 1315, 1325 include Y-axes 1355 that, together with X-axis 1330, frame model output spike trains 1370, 1380. Position along Y-axis 1355 reflects the magnitude of spike in model output spike trains ŷ. Plot 1370 is the actual value of the magnitudes of spikes in a model output spike train ŷ generated in a first trial (i.e., "Trial A"). Plot 1380 is the actual value of the magnitudes of spikes in a model output spike train ŷ generated in a second trial (i.e., "Trial B"). Once again, plots 1350, 1360 are not identical in Trials A and B due to the stochastic noise term in MISO model 100.

Graph 1330 includes a Y-axis 1375 that, together with X-axis 1330, frames an empirical output spike train 1390. Position along Y-axis 1375 reflects the magnitude of spike in the empirical output spike train y. Plot 1390 is the actual value of the magnitudes of spikes in a empirical output spike train y generated by the same set of input spike trains $X_1, X_2, X \ldots, X_N$ used to calculate hidden intermediate variable u shown in plot 1340 in graph 1305.

The similarity between the model output spike trains ŷ and the empirical output spike train y were quantified with a correlation measure involving a Gaussian kernel smoothing procedure. Correlation coefficients r were expressed as functions of the Gaussian smoothing kernel standard deviation $\sigma_g$. Consistent with KS plot results, r results showed that the nonlinear kernel models were significantly more accurate than the linear kernel model in the whole range of $\sigma_g$.

Figure 14:
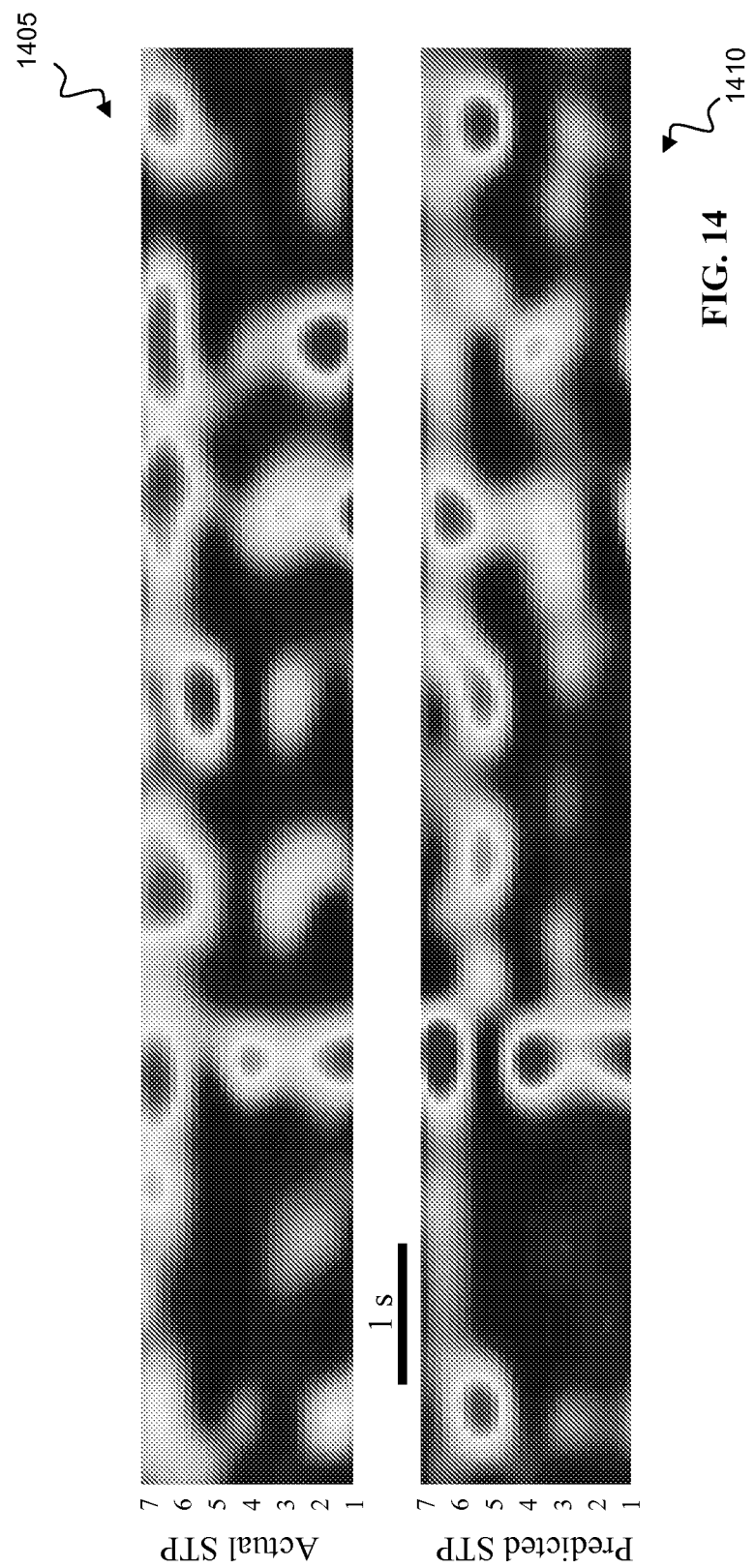
FIG. 14 is a collection of graphs that illustrate the use of the MIMO model of FIG. 2 that includes second order self-kernels to model seven outputs for a set of 16 input spike trains.

FIG. 14 is a collection of graphs 1405, 1410 that illustrate the use of MIMO model 200 that includes second order self-kernels to model seven outputs $Y_1, Y \ldots, Y_N$ for a set of 16 input spike trains $X_1, X_2, X \ldots, X_N$. Graphs 1405, 1410 each include an X-axis 1415 and a Y-axis 1420. The position along X-axis 1415 reflects time. The position along Y-axis 1420 reflects the spatial position. Graph 1405 presents the spatial and temporal positioning of seven empirical outputs $Y_1, Y \ldots, Y_N$ for the set of 16 input spike trains $X_1, X_2, X \ldots, X_N$. Graph 1410 presents the spatial and temporal positioning of seven modeled outputs $Y_1, Y \ldots, Y_N$, obtained using MIMO model 200 for the same set of 16 input spike trains $X_1, X_2, X \ldots, X_N$.

As shown, the use of second order self-kernels in MIMO model 200 can successfully predicted the CA1 spatio-temporal pattern based on CA3 inputs. This MIMO model 200 sufficiently capture the spatio-temporal pattern transformation from CA3 to CA1 in all animals tested, namely, six out of six.

Figures 15, 16:
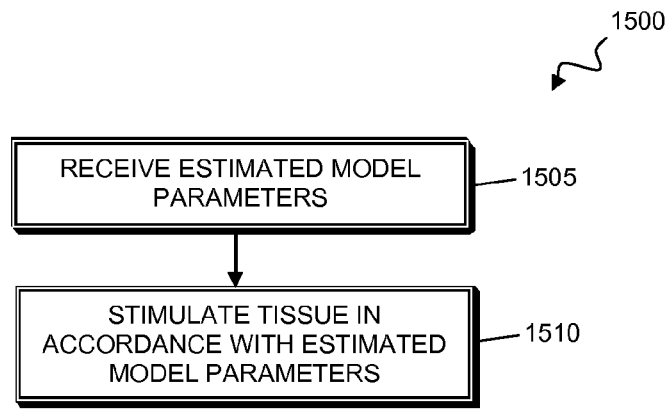
FIG. 15 is a flowchart of a process for stimulating tissue.
FIG. 16 is a schematic representation of a device that can model a non-linear system.

FIG. 15 is a flowchart of a process 1500 for stimulating tissue. All or a portion of process 1500 can be machine-implemented and performed by one or more data processing devices in accordance with the logic of one or more sets of machine-readable instructions. For example, all or a portion of process 1500 can be performed by a computer that is performing operations in accordance with the logic of a set of software. The machine-readable instructions can be stored on one or more data storage devices, such as a magnetic disc, an optical disc, or other memory device. Process 1500 can be performed in isolation or in conjunction with other activities. For example, process 1500 can be performed in conjunction with process 300 (FIG. 3).

The system performing process 1500 can receive a collection of estimated model parameters at 1505. The parameters can be received directly from a system that performs a process such as process 300 (FIG. 3) to estimate the parameters, or the parameters can be received via an intermediary. For example, the estimated model parameters can be retrieved from a machine-readable library of estimated model parameters that capture desired behavior in a collection of different neural tissues. In some implementations, the estimated model parameters can be retrieved based the physiological condition of a specific neural tissue in a patient who is being treated for a disease or other impairment.

The system performing process 1500 can stimulate tissue in accordance with the received estimated model parameters at 1510. For example, in some implementations, the system performing process 1500 can be an implantable stimulator that, after implantation in neural tissue, outputs pulse trains over one or more output electrodes in accordance with the estimated model parameters and pulse trains input over one or more input electrodes. As another example, in some implementations, the system performing process 1500 can be a deep tissue stimulator that outputs pulse trains over one or more output electrodes in accordance with the estimated model parameters.

FIG. 16 is a schematic representation of a device 1600 that can model a non-linear system. For example, device 1600 can model a non-linear system using techniques such as method 1500 (FIG. 15) and can be used to stimulate tissue.

Device 1600 includes a collection of inputs 1605, a collection of outputs 1610, a processing unit 1615, and a data storage 1620. Inputs 1605 can be configured and arranged to receive input signals. For example, in the context of modeling non-linear neural systems, inputs 1605 can be electrodes that are compatible with neural tissue and spaced apart to resolve pulse trains arriving at a physiologically different locations. Outputs 1610 can be configured and arranged to output output signals. For example, in the context of modeling non-linear neural systems, output 1605 can be electrodes that are compatible with neural tissue and spaced apart to trigger individual pulses at physiologically different locations.

Processing unit 1615 is a device that transforms input signals received over inputs 1605 into output signals output over outputs 1610. The transformation performed by processing unit 1615 is non-linear. Processing unit 1615 can base the non-linear transformation on a model of a non-linear system, such as the models discussed above. For example, processing unit 1615 can include one or more of a stochastic noise source and a threshold, such as stochastic noise source 115 and threshold 125 (FIG. 1).

Data storage 1620 is a device that stores one or more characteristics of the non-linear transformation performed by processing unit 1615. For example, in some implementations, data storage 1620 can store estimated model parameters, such as kernel values and the like. As another example, in some implementations, data storage 1620 can store machine-readable instructions for transforming the input signals received over inputs 1605 into output signals output over outputs 1610. Data storage 1620 can be a memory device such as a magnetic or optical disc, a flash memory, or the like.

Implementations described herein can be implemented in digital electronic circuitry, or in computer software, firmware, or hardware, including the structures disclosed in this specification and their structural equivalents, or in combinations of one or more of them. Implementations described herein can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

A number of implementations have been described. Nevertheless, it will be understood that various modifications may be made. Accordingly, other implementations are within the scope of the following claims.

What is claimed is:

1. An apparatus for modeling a non-linear system, comprising:
   a collection of two or more inputs configured and arranged to receive input signals;
   a collection of two or more outputs configured and arranged to output output signals;
   a processing unit configured to transform the input signals into the output signals, wherein the transformation is non-linear; and
   a data storage that stores characteristics of the non-linear transformation, including at least one of
   a first characterization of an impact of a first input signal received on a first of the inputs on an effect that a second input signal received on a second of the inputs has on an output signal output by a first of the outputs, and
   a second characterization of an impact of the first input signal on an effect that a third input signal on the first of the inputs has on the output signal output by a first of the outputs;
   wherein the characteristics comprise values that characterize the non-linear transformation in a multiple input single output model expressed as:

$$w = u(k, x) + a(h, y) + n(\sigma),$$
$$y = \begin{cases} 0 & \text{when } w < \theta \\ 1 & \text{when } w \geq \theta \end{cases},$$

wherein x represents input spike trains, y represents an output spike train, n represents noise with standard deviation $\sigma$, h represents a feedback kernel that describes a transformation from y to an intermediate feedback variable a, k represents feedforward kernels that describe transformation from x to an intermediate variable u, and w represents pre-threshold potential.

2. The apparatus of claim 1, wherein the first characterization comprises a set of feedforward self-kernels and cross-kernels.

3. The apparatus of claim 1, wherein the at least one of the first characterization and the second characterization comprises a decaying feedforward kernel.

4. The apparatus of claim 3, wherein the decaying feedforward kernel comprises a Laguerre kernel.

5. The apparatus of claim 1, wherein the characteristics stored by the data storage further comprise a collection of third order self-kernels.

6. A method for modeling a non-linear system, comprising:
   receiving, at a data processing apparatus, machine-readable information characterizing a collection of two or more inputs and two or more outputs from a multiple input, multiple output non-linear system; and
   estimating, by the data processing apparatus, a collection of parameters for modeling the non-linear system by considering the multiple input, multiple output non-linear system to be a collection of multiple input, single output systems;
   wherein estimating the collection of parameters comprises estimating a collection of kernels that characterize a non-linear transformation in a multiple input single output model expressed as:

$$w = u(k, x) + a(h, y) + n(\sigma),$$
$$y = \begin{cases} 0 & \text{when } w < \theta \\ 1 & \text{when } w \geq \theta \end{cases},$$

wherein x represents input spike trains, y represents an output spike train, n represents noise with standard deviation $\sigma$, h represents a feedback kernel that describes a transformation from y to an intermediate feedback variable a, k represents feedforward kernels that describe transformation from x to an intermediate variable u, and w represents pre-threshold potential.

7. The method of claim 6, wherein estimating the collection of kernels comprises estimating a collection of feedforward cross kernels.

8. The method of claim 6, wherein estimating the collection of kernels comprises estimating a collection of feedforward self kernels.

9. An apparatus for modeling a non-linear system, comprising:
a collection of two or more inputs configured and arranged to receive input signals;
a collection of two or more outputs configured and arranged to output output signals;
a processing unit configured to transform the input signals into the output signals, wherein the transformation is non-linear and treats the non-linear system as a collection of multiple input, single output non-linear systems; and
a data storage that stores characteristics of the transformation;
wherein the characteristics comprise values that characterize the non-linear transformation in a multiple input single output model expressed as:

$$w = u(k, x) + a(h, y) + n(\sigma),$$

$$y = \begin{cases} 0 & \text{when } w < \theta \\ 1 & \text{when } w \geq \theta, \end{cases}$$

wherein x represents input spike trains, y represents an output spike train, n represents noise with standard deviation $\sigma$, h represents a feedback kernel that describes a transformation from y to an intermediate feedback variable a, k represents feedforward kernels that describe transformation from x to an intermediate variable u, and w represents pre-threshold potential.

10. The apparatus of claim 9, wherein the processing unit comprises a stochastic noise source that stochastically changes the transformation of the input signals into the output signals.

11. The apparatus of claim 9, wherein the processing unit comprises a threshold configured to discretize the output signals.

* * * * *